United States Patent [19]
Yabe et al.

[11] Patent Number: 5,596,273
[45] Date of Patent: Jan. 21, 1997

[54] HIGHLY SENSITIVE MAGNETIC FIELD DETECTOR USING LOW-NOISE DC SQUID

[75] Inventors: Satoru Yabe; Norio Chiba; Satoshi Nakayama, all of Chiba, Japan

[73] Assignee: Seiko Instruments Inc., Japan

[21] Appl. No.: 306,411

[22] Filed: Sep. 15, 1994

[30] Foreign Application Priority Data

Sep. 17, 1993 [JP] Japan .................................. 5-231764

[51] Int. Cl.$^6$ .......................... G01R 33/035; H01L 39/22
[52] U.S. Cl. ............................................. 324/248; 505/846
[58] Field of Search ............................ 324/248; 505/845, 505/846

[56] References Cited

U.S. PATENT DOCUMENTS 5,306,521  4/1994  Shimizu et al. ........................ 324/248

Primary Examiner—Walter E. Snow
Attorney, Agent, or Firm—Adams & Wilks

[57] ABSTRACT

DC-SQUID includes an input coil for transmitting an external magnetic field signal as a signal current from a detection coil, a washer coil to which the signal current is input as a signal magnetic flux, two Josephson devices for converting the signal magnetic flux transmitted to the washer coil to a signal voltage, shunt resistors and a damping resistor which are connected to each of the Josephson devices in parallel and in series respectively to extinguish the hysteresis of the current-voltage characteristic, and a feedback modulation coil to which a feedback and modulation current is transmitted from an external control circuit. The feedback modulation coil is arranged so as to linearly traverse over the upper portion or lower portion of the washer coil. The mutual inductance Mms between a washer coil and a feedback modulation coil is set to be smaller than the self inductance Lw of the washer coil, to thereby making the magnetic field sensitivity excellent, the SN ratio of an DS-SQUID is improved, and RF noises are reduced.

15 Claims, 3 Drawing Sheets

HIGHLY SENSITIVE MAGNETIC FIELD DETECTOR USING LOW-NOISE DC SQUID

BACKGROUND OF THE INVENTION

This invention relates to a DC Superconducting Quantum Interference Device (hereinafter referred to as "DC-SQUID").

FIG. 6 is a plan view of a DC-SQUID known in the prior art. The DC SQUID comprises an input coil 1 for transmitting an external magnetic field signal as a signal current from a detection coil, a washer coil 2 to which the signal current is input as a signal magnetic flux, two Josephson junction devices 3 for converting the signal magnetic flux transmitted to the washer coil 2 to a signal voltage, shunt resistors 4 which are connected to the Josephson junction devices in parallel respectively to extinguish the hysteresis of a current voltage characteristic, a dampening resistor 5 which is connected to the Josephson junction devices in series, and a feedback modulation coil 6 for transmitting a feedback and modulation current from an external control circuit. The feedback modulation coil 6 is arranged near one turn at the upper portion or lower portion of the washer coil 2.

In order to obtain a high coupling coefficient k(iw) and a small parasitic capacitance, the inner diameter of the washer coil 2 is set to be large to make the self inductance Lw of the washer coil 2 large.

In general, the self inductance Lm of the feedback modulation coil 6 satisfies the following equation:

$$Lm = 2n \times Lw + Ls \quad (1)$$

where Ls is the strip line inductance of the feedback modulation coil 6 n is the turn number of the feedback coil, and Lw is the self inductance of the washer coil 2.

Further, the mutual inductance Mms between the washer coil 2 and the feedback modulation coil 6 satisfies the following equation:

$$Mms = k(ms) \times \sqrt{(Lw \times Lm)} \quad (2)$$

where k(ms) is the coupling coefficient between the washer coil 2 and the feedback modulation coil 6.

When the feedback modulation coil 6 is designed to have the one-turn arrangement at the upper portion or lower portion of the washer coil 2 like the prior art, n=1 and k(ms)=1. Therefore, the following equation is approximately satisfied from the equations (1) and (2):

$$Mms = Lw \quad (3)$$

In general, the magnetic-field sensitivity α of the SQUID and Mms are inversely proportional to each other. Therefore, since Mms is larger as the self inductance is larger, the magnetic-field sensitivity α is reduced and the SN ratio is deteriorated. Further, magnetic flux noise Φn which intersect to the washer coil 2 through the feedback modulation coil 6, such as an environmental noise and an RF noise from the external control circuit are intensified, and thus there occurs a problem that a magnetic flux-voltage conversion efficiency of the SQUID is reduced.

SUMMARY OF THE INVENTION

It is an object of the present invention to provide a DC-SQUID with improved SN ratio and reduced RF noise.

In order to achieve the above object, the mutual inductance Mms between the washer coil and the feedback modulation coil is set to be equal to or less than the self inductance of the washer coil. Accordingly, to reduce the coupling coefficient k(ms) between the feedback modulation coil and the washer coil of equation (2), the feedback modulation coil is designed to be arranged at one or less turn, or it is designed not to be overlapped with the inside of the washer coil, or so that the self inductance Lm thereof is small.

When the detector is designed so that the mutual inductance Mms between the washer coil and the feedback modulation coil is equal to or less than the self inductance of the washer coil, the magnetic field sensitivity of the SQUID to the feedback current becomes excellent, so that the SN ratio is improved, the RF noises is reduced and the SQUID characteristic is improved.

DETAILED DESCRIPTION OF THE PREFERRED EMBODIMENTS

Embodiments according to the present invention will now be described with reference to the accompanying drawings.

Figure 1:
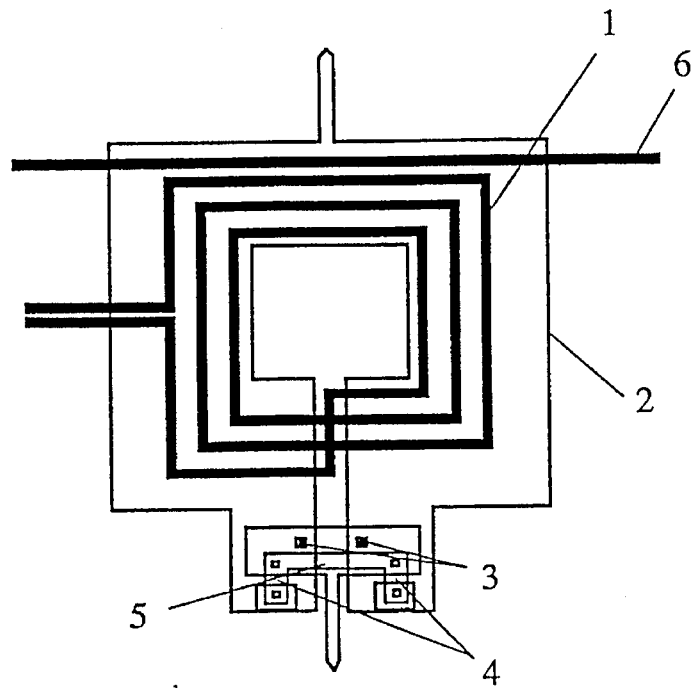
FIG. 1 is a plan view of a DC-SQUID of the first embodiment of a highly sensitive magnetic field detector according to this invention.

FIG. 1 is a plan view of a DC-SQUID of the first embodiment according to this invention. The DC-SQUID comprises an input coil 1 for transmitting an external magnetic field signal as a signal current from a detection coil (not shown), a washer coil 2 to which the signal current is input as a signal magnetic flux, two Josephson junction devices 3 for converting the signal magnetic flux transmitted to the washer coil 2 to a signal voltage, shunt resistors 4 and a dampening resistor 5 which are connected to each of the Josephson junction devices 3 in parallel and in series respectively to extinguish the hysteresis of the current-voltage characteristic, and a feedback modulation coil 6 to which a feedback and modulation current is transmitted from an external control circuit. As shown, the feedback modulation coil 6 is arranged so as to linearly traverse over the upper portion or lower portion of the washer coil 2.

Figure 2:
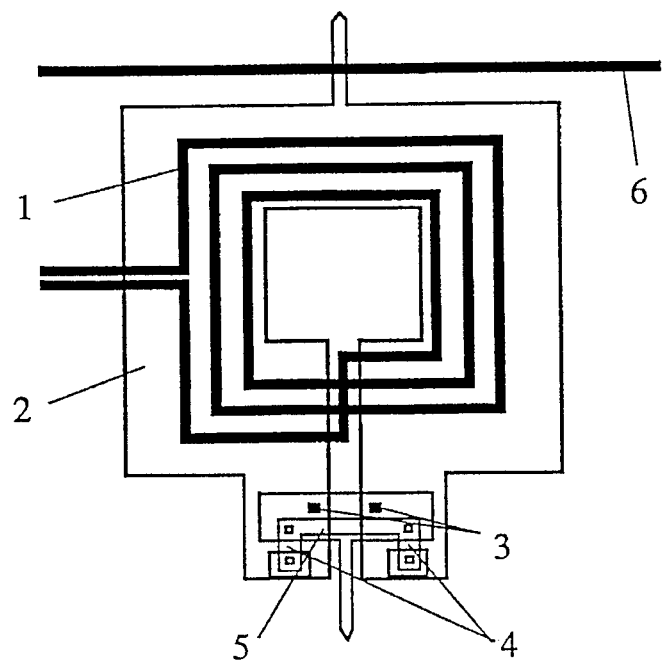
FIG. 2 is a plan view showing a DC-SQUID of the second embodiment of the highly sensitive magnetic field detector according to this invention.

FIG. 2 is a plan view of a DC-SQUID of the second embodiment according to this invention. In this embodiment, the feedback modulation coil 6 is linearly disposed adjacent to the washer coil 2 so that the feedback modulation coil 6 is not overlapped with the upper portion or lower portion of the washer coil 2.

Figure 3:
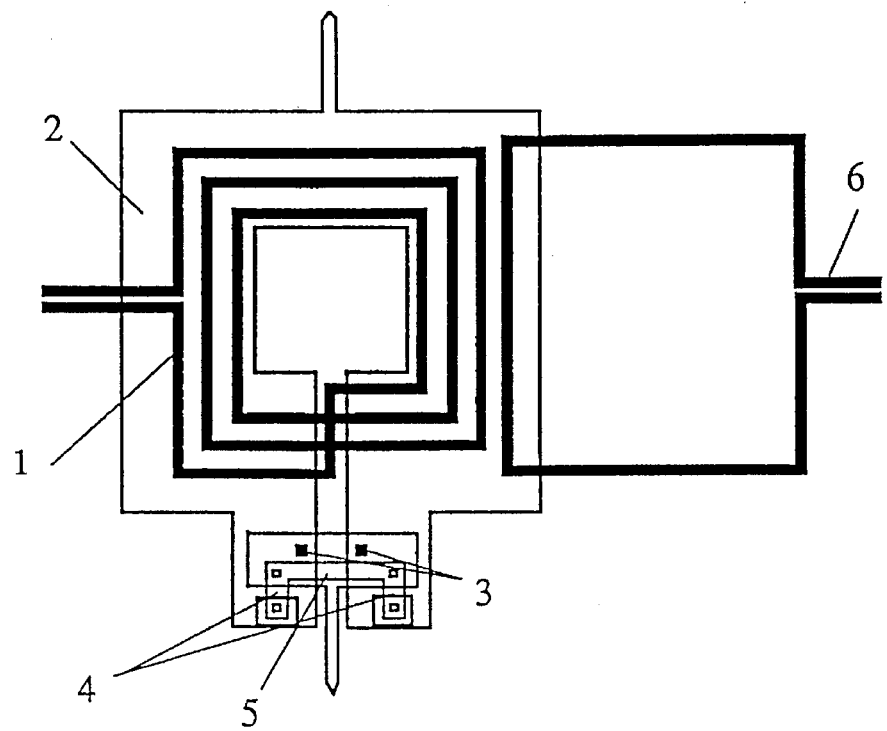
FIG. 3 is a plan view showing a DC-SQUID of the third embodiment of the highly sensitive magnetic field detector according to this invention.

FIG. 3 is a plan view of a DC-SQUID of the third embodiment according to this invention. In this embodiment, the feedback modulation coil 6 is arranged at one turn so as to be partially overlapped with the side portion of the washer coil 2, but not to surround the inside of the washer coil 2.

Figure 4:
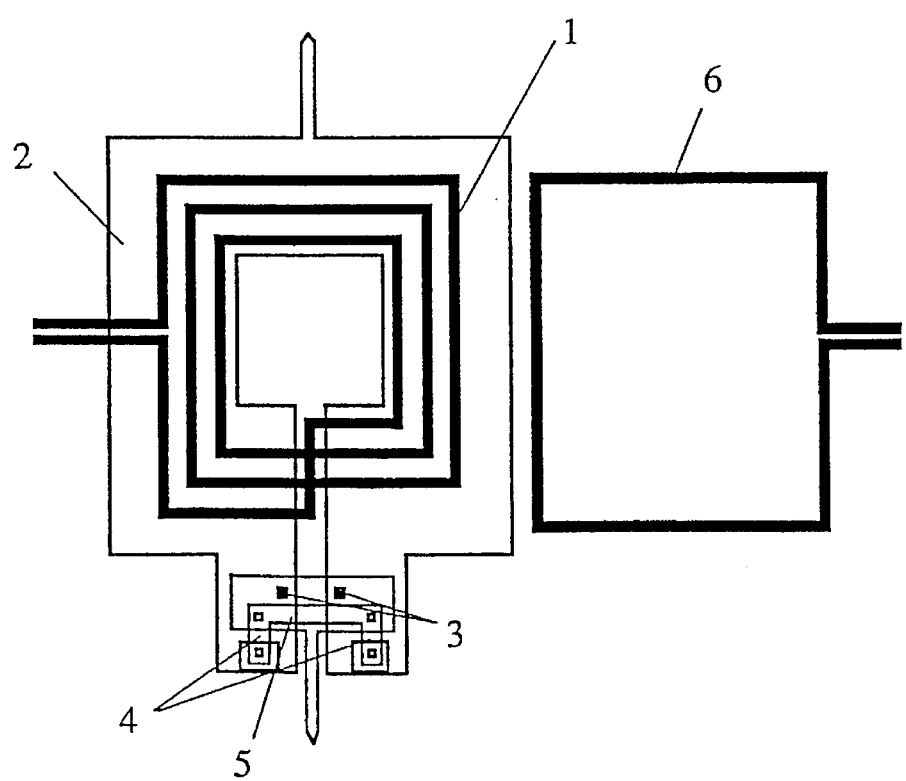
FIG. 4 is a plan view showing a DC-SQUID of the fourth embodiment of the highly sensitive magnetic field detector according to this invention.

FIG. 4 is a plan view of a DC-SQUID of the fourth embodiment according to this invention. In this embodiment, the feedback modulation coil 6 is arranged at one turn in the neighborhood of the washer coil 2 so that it is not overlapped with the side portion of the washer coil 2 and does not surround the inside of the washer coil 2.

Figure 5:
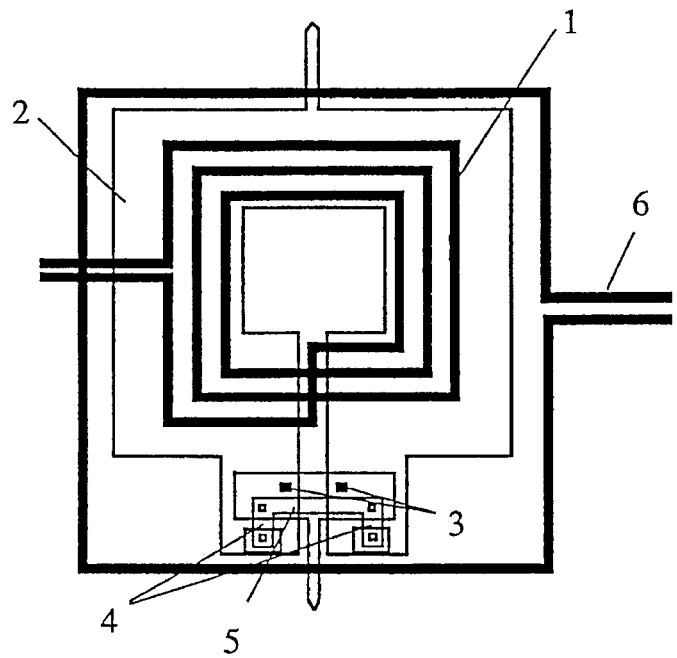
FIG. 5 is a plan view showing a DC-SQUID of the fifth embodiment of the highly sensitive magnetic field detector according to this invention.
Figure 6:
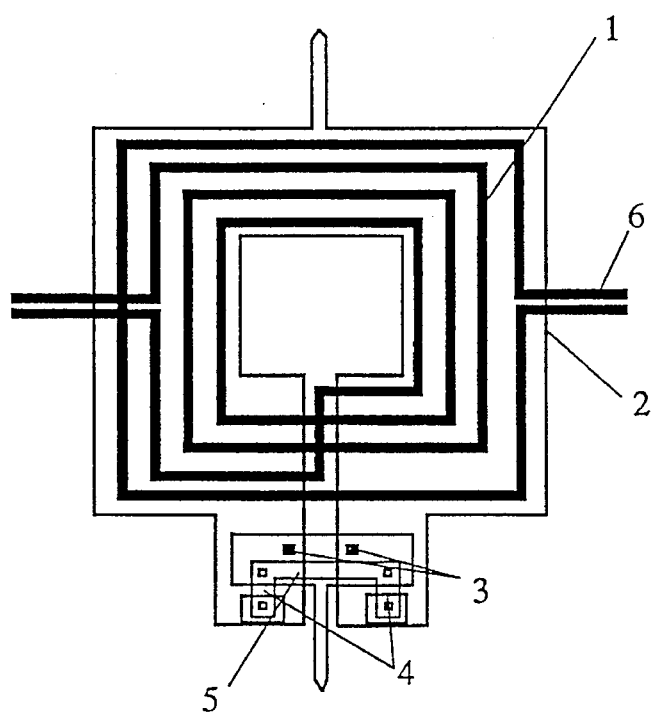
FIG. 6 is a plan view showing a DC-SQUID of a conventional highly sensitive magnetic field detector.

FIG. 5 is a plan view of a DC-SQUID of the fifth embodiment according to this invention. In this embodiment, the feedback modulation coil 6 is arranged at one turn so that it is not overlapped with the washer coil 2, but surrounds the washer coil 2.

The arrangements of the feedback modulation coil 6 of the above embodiments may be used for a DC-SQUID having a plurality of washer coils such that the DC-SQUID comprises an input coil 1 for transmitting an external magnetic field signal as a signal current from the detection coil, three washer coils 2 which are connected to one another in an 8 shaped form and to which the signal current is input as a signal magnetic flux, two Josephson junction devices 3 which serve to convert the signal magnetic flux transmitted to the washer coils 2 to a signal voltage and are connected to the washer coils 2 in series, shunt resistors 4 and a dampening resistor 5 which are connected to each of the Josephson junction devices in parallel and in series respectively to extinguish the hysteresis of the current-voltage characteristic, and a feedback modulation coil 6 to which a feedback and modulation current is transmitted from an external control circuit. The arrangements may also be used for a DC-SQUID of double washer type such as that wherein two Josephson junction devices are connected to two washer coils in parallel.

In these embodiments, an insulation layer is inserted between respective layers of each coil and each resister, in which the order of lamination of each layers is not limited.

In the high sensitive magnetic field detector of this invention, the mutual inductance Mms between the feedback modulation coil and the washer coil is set to be smaller than the self inductance Lw of the washer coil, to thereby enhance the magnetic field sensitivity, so that the SN ratio is improved, and reducing the RF noises and improving the SQUID characteristic, so that the noise level of SQUID is reduced.

What is claimed is:

1. A highly sensitive DC SQUID comprising: an input coil for inputting a signal current converted from a detected magnetic field by a detection coil which is superconductively coupled to the input coil; a feedback modulation coil for transmitting a control signal from an external control system; a washer coil which is magnetically coupled to the input coil and the feedback modulation coil and constitutes a superconductive ring; a Josephson junction device having a barrier layer sandwiched between a lower electrode and an upper electrode, for converting the signal current to a voltage, and being connected to the washer coil; and a shunt resistor which is connected to the Josephson junction device in parallel; wherein the feedback modulation coil is arranged such that the mutual inductance between the washer coil and the feedback modulation coil is equal to or less than the self inductance of the washer coil.

2. A highly sensitive DC SQUID according to claim 1; wherein the feedback modulation coil is arranged to be spaced apart from an upper portion and a lower portion of the washer coil.

3. A highly sensitive DC SQUID according to claim 1; wherein at least part of the feedback modulation coil is formed in a linear shape.

4. A highly sensitive DC SQUID according to claim 1; wherein a part of the feedback modulation coil is arranged to be overlapped with one of an upper portion and a lower portion of the washer coil.

5. A highly sensitive DC SQUID according to claim 1; wherein the washer coil comprises at least two washer coils which are connected to the Josephson junction device.

6. A DC SQUID comprising: a washer coil defining a superconducting ring; Josephson junctions coupled to both ends of the washer coil; a shunting resistor connected in parallel to the Josephson junctions; a dampening resistor coupled to both ends of the washer coil; an input coil magnetically coupled to the washer coil for inputting a signal current corresponding to an external magnetic field; and a feedback modulation coil magnetically coupled to the washer coil for transmitting a control signal thereto; wherein the feedback modulation coil is arranged such that the mutual inductance between the washer coil and the feedback modulation coil is no greater than the self-inductance of the washer coil.

7. A DC SQUID according to claim 6; wherein the input coil is connected to an external detection coil for transmitting an external magnetic field signal as a signal current from the detection coil.

8. A DC SQUID according to claim 6; wherein the feedback modulation coil is connected to an external control system for transmitting the control signal to the washer coil.

9. A DC SQUID according to claim 6; wherein the self-inductance Lm of the feedback modulation coil satisfies the following relation:

$$Lm = 2n \times Lw \times Ls$$

wherein Ls is the strip line inductance of the feedback modulation coil, n is the number of turns of the feedback modulation coil, and Lw is the self-inductance of the washer coil.

10. A DC SQUID according to claim 6; wherein the mutual inductance Mms between the washer coil and the feedback modulation coil is defined by the following equation:

$$Mms = K(ms) \times (Lw \times Lm)^{1/2}$$

wherein K(ms) is a coupling coefficient between the washer coil and the feedback modulation coil, Lw is the self-inductance of the washer coil, and Lm is the self-inductance of the feedback modulation coil.

11. A DC SQUID according to claim 6; wherein the feedback modulation coil has a one-turn arrangement proximate one side of the washer coil and wherein the mutual inductance Mms between the washer coil and the feedback modulation coil is defined by the equation Mms=Lw, wherein Lw is the self-inductance of the washer coil.

12. A DC SQUID according to claim 6; wherein the feedback modulation coil is arranged to partially overlap only one side of the washer coil.

13. A DC SQUID according to claim 12; wherein the feedback modulation coil has a linear form.

14. A DC SQUID according to claim 6; wherein the feedback modulation coil is arranged proximate to but not overlapping any portion of the washer coil.

15. A DC SQUID according to claim 14; wherein at least part of the feedback modulation coil has a linear form.

* * * * *